United States Patent
Welty

(10) Patent No.: US 7,570,113 B2
(45) Date of Patent: Aug. 4, 2009

(54) OVERLOAD RECOVERY CIRCUIT FOR FOLDED CASCODE AMPLIFIERS

(75) Inventor: Mark Benjamin Welty, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 11/903,645

(22) Filed: Sep. 24, 2007

(65) Prior Publication Data

US 2009/0079503 A1    Mar. 26, 2009

(51) Int. Cl.
*H03F 3/45* (2006.01)
(52) U.S. Cl. ............................ 330/253; 330/255
(58) Field of Classification Search ................ 330/252, 330/253, 255, 262, 269
See application file for complete search history.

(56) References Cited

U.S. PATENT DOCUMENTS 6,317,000 B1 * 11/2001 Ivanov et al. ............... 330/255
7,342,450 B2 * 3/2008 Jones .......................... 330/253

* cited by examiner

*Primary Examiner*—Khanh V Nguyen
(74) *Attorney, Agent, or Firm*—William B. Kempler; Wade J. Brady, III; Frederick J. Telecky, Jr.

(57) ABSTRACT

In a method and apparatus for rapidly recovering an improved amplifier from an overload condition, a cascode amplifier (CASA) having a pair of inputs and an output is coupled to an overload recovery circuit (ORC). The pair of inputs is coupled to receive a differential input signal. A deviation in the differential input signal that is greater than a threshold causes a deviation in a current provided to at least one transistor included in the CASA. The deviation in the current causes the CASA to operate in an overload condition (OC). The ORC includes a makeup current circuit operable to generate an overload current in response to the OC and a controller operable to control a voltage at the output during the OC. The controller coupled to the makeup current circuit provides the overload current to the CASA to enable the rapid recovery from the OC.

20 Claims, 6 Drawing Sheets

TABLE
102

| CURRENT | STEADY-STATE VALUE 104 | OVERLOAD CONDITION VALUE Vinm 112 > Vinp 114 106 |
|---|---|---|
| Ib 194 | Ib | Ib |
| IM 196 | Ib/2 | Ib/2 − deltal |
| IP 198 | Ib/2 | Ib/2 + deltal |
| I1 136 | Ib/2 | Ib/2 − deltal |
| I2 138 | Ib/2 | Ib/2 − deltal |
| I3 131 | Ib | Ib |
| I4 133 | Ib | Ib |
| I5 156 | Ib/2 | Ib/2 − deltal |
| I6 164 | Ib/2 | Ib/2 |
| I7 174 | Idiff = I6 − I5 = 0 | Idiff = I6 − I5 = deltal |
| I8 154 | 2*Idiff = 0 | 2*Idiff = 2*deltal |

*FIG. 1B*

OVERLOAD RECOVERY CIRCUIT FOR FOLDED CASCODE AMPLIFIERS

BACKGROUND

The present disclosure relates generally to electronic circuits, and more particularly to a method and an apparatus for improving the performance of amplifiers.

In analog or mixed circuit design, it is desirable for amplifiers to have a high gain, large bandwidth, high input impedance, low output impedance, and linear performance. It is well known that amplifiers having transistors coupled in a cascode topology (typically include telescopic cascode and folded cascode configurations) provide higher effective load resistance, reduce voltage-induced nonlinearities, and reduce Miller effect (caused by coupling between the output and the input). The folded cascode amplifier topology may be used to improve output range compared to the telescopic cascode. It is desirable that transistors used in the folded cascode amplifier operate in the saturation region to provide constant current. However, changes in the input(s) to the folded cascode amplifier may cause the folded cascode amplifier to operate in an overload condition. That is, changes in the input voltage of the folded cascode amplifier which exceed a threshold value may cause the output of the folded cascode amplifier to swing in an uncontrolled manner to a high or low voltage supply level during the overload. The overloading on the folded cascode amplifier reduces the effectiveness of the cascode current mirrors.

Upon removing the stimulus causing the overload, a recovery of the folded cascode amplifier from the overload condition includes restoring the transistors to operate in the saturation region. However, due to the presence of parasitic capacitance of the transistors or use of a compensation capacitor, performance of the folded cascode amplifier while recovering from the overload condition may become too slow for some applications such as high speed analog or mixed signal circuits. Therefore, a need exists to provide an improved folded cascode amplifier that is capable of recovering quickly from an overload condition.

SUMMARY

Applicant recognizes that the overload condition of a folded cascode amplifier is caused by a deficit in current provided to the transistors, thereby forcing one or more transistors to operate in a triode region instead of the saturation region. Applicant also recognizes that an overload condition typically causes parasitic capacitances of transistors or compensation capacitors to discharge. A time to recover from the overload condition once the stimulus causing the overload is removed is negatively affected since available current during recovery is first used to recharge the discharged capacitances before the amplifier becomes operational, e.g., before the transistors are restored to operate in the saturation region. Applicant further recognizes that it would be desirable to control a voltage at an output of the amplifier to reduce the recovery time since without proper controls the voltage at the output is rapidly driven to a high or low supply voltage in the overload condition, depending on the changes in the input voltage. Therefore, it would be desirable to provide an improved folded cascode amplifier that is capable of rapidly recovering from an overload condition. Accordingly, it would be desirable to provide a method and apparatus for recovering from an overload condition, absent the disadvantages found in the prior methods discussed above.

The foregoing needs are addressed by the teachings of the present disclosure, which relates to an apparatus and method for rapid recovery from an overload condition. According to one embodiment, in an apparatus and method for rapidly recovering an improved amplifier from an overload condition, a cascode amplifier (CASA) having a pair of inputs and an output is coupled to an overload recovery circuit (ORC). The pair of inputs is coupled to receive a differential input signal. A deviation in the differential input signal that is greater than a threshold causes a deviation in a current provided to at least one transistor included in the CASA. The deviation in the current causes the CASA to operate in an overload condition (OC). The ORC includes a makeup current circuit operable to generate an overload current in response to the OC and a controller operable to control a voltage at the output during the OC. The controller coupled to the makeup current circuit provides the overload current to the CASA to enable the rapid recovery from the OC.

In one aspect of the disclosure, a method for overload recovery of a cascode amplifier includes providing a differential input signal that is greater than a threshold, thereby causing a deviation in a current provided to at least one transistor included in the cascode amplifier. The deviation in the current is mirrored in an overload recovery circuit (ORC) and sourced to a comparison node of the ORC, the ORC being coupled to the cascode amplifier. At least a portion of a steady-state current is drawn from the comparison node, the steady-state current being generated in response to the differential input signal being balanced. Currents flowing in and out of the comparison node are balanced. The balancing of the currents includes causing a sum of the deviation current, the portion of the steady-state current, and a difference current sourced to the comparison node to be equal to zero. An overload current is generated, the overload current being derived as a function of the difference current. The overload current is provided to the at least one transistor, the overload current being sufficient to operate the at least one transistor in a saturation region, thereby enabling the overload recovery of the cascode amplifier.

In another aspect of the disclosure, an apparatus and method for rapidly recovering an improved amplifier from an overload condition includes a cascode amplifier having a pair of inputs and an output. The output is coupled to a first one of the pair of inputs in a unity gain configuration of the cascode amplifier. A second one of the pair of inputs is coupled to receive an input signal. An output signal provided at the output is configured to add a bias voltage to the input signal. The output signal and the input signal being forced to zero, e.g., due to external drivers, causes a deviation in a current provided to at least one transistor included in the cascode amplifier, the deviation in the current causing the cascode amplifier to operate in an overload condition. An overload recovery circuit (ORC) coupled to the cascode amplifier includes a makeup current circuit operable to generate an overload current in response to the overload condition. A controller is operable to control a base voltage during the overload condition, the controller being coupled to the makeup current circuit provides the overload current to the cascode amplifier. An output driver circuit, which is coupled to the ORC and the cascode amplifier, includes a driver switch controlled by the base voltage, the driver switch being operable to disable the output in response to the overload condition.

Several advantages are achieved by the method and apparatus according to the illustrative embodiments presented herein. The embodiments advantageously provide an improved amplifier that is operable to rapidly recover from an overload condition especially when compared to the recovery time for an overloaded traditional amplifier. The recovery time is advantageously improved by generating additional current that is sufficient to enable the transistors to operate in the saturation region instead of operating in the triode region. Rapid recovery from the overload condition may advantageously enable the improved amplifier to be included in time sensitive applications such as high speed analog or mixed signal circuits such as wireless communication. The improved amplifier also advantageously controls a voltage at the output to a desired level. That is, instead of allowing the voltage at the output of the traditional amplifier in an overload condition to swing to a high or low power supply voltage, the voltage at the output of the improved amplifier is advantageously controlled to the desired level. Controlling the voltage at the output may also advantageously reduce the recovery time since the parasitic capacitances of the transistors are not fully discharged during the overload condition. In some applications, controlling the voltage at the output may be used to advantageously disable the output during the overload condition.

BRIEF DESCRIPTION OF THE DRAWINGS

FIG. 1B illustrates in a tabular form an analysis of currents flowing through an improved amplifier operating in a steady-state and in an overload condition described with reference to FIG. 1A, according an embodiment;

DETAILED DESCRIPTION

Figure 1A:
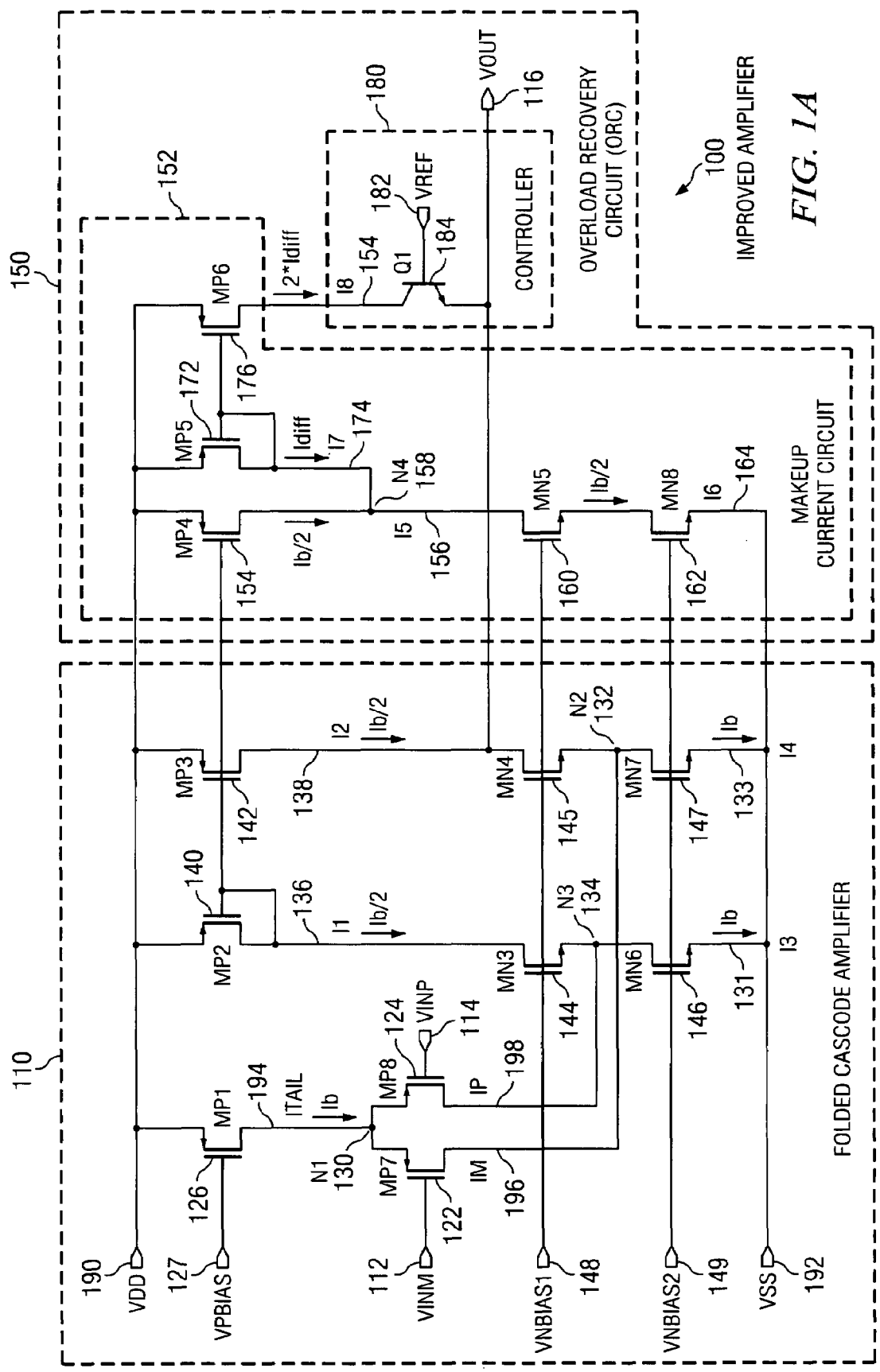
FIG. 1A illustrates a circuit diagram of an improved amplifier, according an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

The traditional folded cascode amplifier may not be able to recover from an overload condition in a timely manner to support high speed electronic circuit applications. The presence of parasitic capacitance of the transistors or use of a compensation capacitor negatively affects the recovery time since current available to recover is used to recharge the capacitors instead of enabling the transistors to operate in the saturation mode. Therefore, a need exists to provide a method and apparatus for rapidly recovering from an amplifier overload condition. This problem may be addressed by an improved apparatus and method for providing additional current to enable the transistors to operate in the saturation mode.

According to one embodiment, in a method and apparatus for rapidly recovering an improved amplifier from an overload condition, a cascode amplifier (CASA) having a pair of inputs and an output is coupled to an overload recovery circuit (ORC). The pair of inputs is coupled to receive a differential input signal. A deviation in the differential input signal that is greater than a threshold causes a deviation in a current provided to at least one transistor included in the CASA. The deviation in the current causes the CASA to operate in an overload condition (OC). The ORC includes a makeup current circuit operable to generate an overload current in response to the OC and a controller operable to control a voltage at the output during the OC. The controller coupled to the makeup current circuit provides the overload current to the CASA to enable the rapid recovery from the OC.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a gain of an amplifier may be configured to be equal to one (1) to enable an output signal to simply track an input signal.

Amplifier—An electronic circuit that draws power from a power source to boost or amplify one or more input signals. Some amplifiers may be configured to simply track or isolate an input signal without providing amplification. Some of the desirable amplifier characteristics include high input impedance, high gain, and low output impedance. Amplifiers may be configured in multiple topologies including cascade, cascode, folded cascode, and similar others to achieve desired characteristics.

Amplifier overload condition—An abnormal operating state of an amplifier caused when one or more operating parameters of the amplifier exceeds a threshold, e.g., one or more inputs is greater than a threshold or an amplifier gain is greater than a threshold. When operating in the overload condition, the output of the amplifier may not be in accordance with the input(s).

An apparatus in the form of an improved amplifier having a differential input and having an improved recovery time from an overload condition compared to a traditional amplifier is described with reference to FIGS. 1A, and 1B. Various embodiments of an improved amplifier configured as a unity gain follower and having an improved recovery time from an overload condition compared to a traditional amplifier is described with reference to FIGS. 2, 3, and 4. A method for rapidly recovering from an overload condition of an improved amplifier is described with reference to FIG. 5.

FIG. 1A illustrates a circuit diagram of an improved amplifier 100, according to an embodiment. In the depicted embodiment, the improved amplifier 100 includes a folded cascode amplifier 110 coupled to an overload recovery circuit (ORC) 150 and a controller 180. In a particular embodiment, the ORC 150 may include the controller 180. The improved amplifier 100 is powered by a first power supply Vdd 190 and a second power supply Vss 192. The cascode amplifier 110 includes a pair of inputs Vinm 112, Vinp 114, and an output Vout 116. The pair of inputs 112 and 114 is coupled to receive a differential input signal. In a steady-state operation of the improved amplifier 100, the voltage received at the pair of inputs Vinm 112, Vinp 114 is balanced, e.g., the differential input signal is zero. The pair of inputs 112 and 114 provide a bias signal to control switches mp7 122 and mp8 124 (referred to as a differential input pair of transistors) respectively. A switch mp1 126 is controlled by a bias signal vpbias 127 to control a tail current Ib 194, which is provided to node N1 130 that is coupled to the source of the switches mp7 122 and mp8 124. In dependence of the differential input signal received at pair of inputs Vinm 112 and Vinp 114, a current Im 196 flows through the switch mp7 122 and is provided to node N2 132. Similarly, a current Ip 198 flows through the switch mp8 124 and is provided to node N3 134. In the steady-state of operation of the improved amplifier 100, currents Im 196 and Ip 198 are each equal to 50% of Ib 194.

Included in the folded cascode amplifier 110 are switches mp2 140 and mp3 142 coupled as a current mirror that is controlled by the tail current Ib 194. In a steady-state operation, the current mirror is operable to generate a portion, e.g., 50%, of the tail current Ib 194. The gates of the switches mp2 140 and mp3 142 are coupled to one another and coupled to the drain of the mp2 140 to form the current mirror. Specifically, a current I1 136 is provided by the mp2 140 and a current I2 138 is provided by mp3 142, with I1 136 being equal to I2 138 due to the current mirror arrangement. In the steady-state, each one of the current I1 136 and the current I2 138 is equal to 50% of Ib 194. Switches mn3 144 and mn6 146, which are coupled in a cascoded arrangement, and current mirror switch mp2 140 form a cascode left leg of the folded cascode amplifier 110, and current switches mn4 145 and mn7 147, which are also coupled in a cascoded arrangement, to form a cascode right leg of the folded cascode amplifier 110. The node N3 134 segments the cascode left leg into an upper cascode left leg and a lower cascode left leg. Similarly, the node N2 132 segments the cascode right leg into an upper cascode right leg and a lower cascode right leg.

The switches mn3 144 and mn4 145 are controlled by biasing the gates of these switches by vnbias1 148. Similarly, the switches mn6 146 and mn7 147 are controlled to generate a drain current equal to Ib 194 by biasing the gates of these switches to vnbias2 149. The output Vout 116 is formed by coupling the drain of mp3 142 and the drain of mn4 145. Since the net sum of the currents flowing into the nodes N2 134 and N3 134 and flowing out of the nodes and N2 134 and N3 134 is zero, a current I3 131 flowing through mn6 146 is a sum of the currents Ip 198 and I1 136 and a current I4 133 flowing through mn7 is a sum of the currents Im 196 and I2 138. In the steady-state, I3 131 and I4 is each equal to Ib 194 and the switches mn3 144, mn6 146, mn4 145, and mn7 147 are operating in a saturation region, e.g., operable to provide a constant drain current that is substantially independent of drain-to-source voltage. In the saturation region, an amount of the drain current generated by the switches mn3 144, mn6 146, mn4 145, and mn7 147 is dependent on the gate-to-source voltage that is greater than a threshold.

In a particular embodiment, the improved amplifier 100 is operable in a plurality of operating modes including the steady-state mode and an overload mode (also referred to as an overload condition). As described earlier, in the steady-state mode (also referred to as an equilibrium mode) of operation of the improved amplifier 100, the voltage received at the pair of inputs Vinm 112, Vinp 114 is balanced and the switches mn3 144, mn6 146, mn4 145, and mn7 147 are operating in the saturation region. In the depicted embodiment, the improved amplifier 100 is operable to provide an improved recovery time compared to the traditional folded cascode amplifier when the input Vinm 112 is greater than or equal to Vinp 114. In an exemplary, non-depicted embodiment, it is understood that the improved amplifier 100 may also be configured to handle the input Vinm 112 being less than Vinp 114 by adding similar switches and current mirror circuits.

Referring back to FIG. 1A, the overload condition is an abnormal operating state of the improved amplifier 110 which may be entered into or caused when one or more operating parameters or attributes of the improved amplifier 100 exceeds a threshold, e.g., a difference between the inputs Vinm 112, Vinp 114 is greater than a threshold. The difference between the inputs Vinm 112, Vinp 114 being greater than the threshold causes a current imbalance (or deviation in a flow of the current) in the folded cascode amplifier 110 compared to the flow of currents in the steady-state. The deviation in the current beyond a threshold causes at least one transistor switch of the folded cascode amplifier 110, e.g., at least one of switches mn3 144, mn6 146, mn4 145, and mn7 147 to operate in a triode mode instead of the saturation mode, thereby resulting in the overload condition. The improved amplifier 100 may return to the steady state from the overload condition when the stimulus is removed, e.g., when difference between the inputs Vinm 112, Vinp 114 is less than the threshold. Additional details of the currents flowing through the improved amplifier 100 in a steady-state condition and the deviation or imbalances in the flow of currents during an overload condition are described with reference to FIG. 1B.

Referring back to FIG. 1A, when operating in the steady-state condition, or when the voltage received at the pair of inputs Vinm 112, Vinp 114 is less than the threshold, or when the switches mn3 144, mn6 146, mn4 145, and mn7 147 are operating in the saturation region, the ORC 150 and the controller 180 are operable to simply pass through an output signal provided by the folded cascode amplifier 110 at Vout 116. When the folded cascode amplifier 110 is operating in an overload condition, the ORC 150 and the controller 180 are operable to advantageously generate an overload current (identified as I8) 154 that is sufficient to correct the imbalance in the currents and enable the switches mn3 144, mn6 146, mn4 145, and mn7 147 to exit the triode region and operate in the saturation region. Thus, the overload current I8 154, which is derived from the deviation or imbalance in the flow of the current, is generated by the ORC 150 and provided by the controller 180 to at least one transistor switch of the folded cascode amplifier 110 to enable operation of the at least one transistor in the saturation mode.

In the depicted embodiment, the ORC 150 includes a makeup current circuit 152 operable to provide the overload current I8 154 to the folded cascode amplifier 110 in response to the overload condition. The controller 180 is operable to advantageously control a voltage at the output Vout 116 during the overload condition by applying a bias voltage 182 to control an output switch 184. In an embodiment, the output switch 184 is implemented as a bipolar junction transistor (BJT) device. When operating in the overload condition, the controller 180 provides the overload current I8 154 to the folded cascode amplifier 110. In addition during the overload condition, the output Vout 116 of the improved amplifier 100 is advantageously controlled by configuring the bias voltage 182. In a particular embodiment, the bias voltage 182 is configurable to offset a temperature dependence of the base-to-emitter voltage of the BJT device. In a particular embodiment, the voltage at Vout 116 is equal to the bias voltage 182 less the base-to-emitter voltage of the BJT device, the emitter of the BJT device being coupled to the Vout 116. This is in contrast to an output of a traditional folded cascode amplifier which may uncontrollably swing to a high or low voltage level corresponding to the power supply voltages and the output may not be in accordance with its inputs.

In the depicted embodiment, the makeup current circuit 152 includes a deviation current source configured as a switch mp4 154. The deviation current source is operable as a current mirror to generate a current I5 156 that is controlled by the current I1 136. Thus, the current I5 156 provides a mirror of the current I1 136, which mirrors a deviation or imbalance in the current present in the cascode amplifier 110 operating in the overload condition. In the steady-state of operation, the current I5 156 is equal to I1 136, which is equal to 50% of Ib 194. The current I5 156 is provided to a comparison node N4 158. Similar to the switches mn3 144 and mn6 146, switches mn5 160 and mn8 162 are coupled in a cascoded arrangement between the node N4 158 and the Vss 192 and are respectively biased by vnbias1 148 and vnbias2 149. Switches mn5 160, mn8 162, and current mirror switch mp4 140 form a cascode leg of the makeup current circuit 152.

The comparison node N4 158 is formed by coupling the drain of mp4 154 to the drain of mn5 160. A current I6 164 flows through the cascoded switches mn5 160 and mn8 162. In the steady-state of operation, the current I6 164 is equal to I5 156, which is equal to 50% of Ib 194. A makeup current source 170 implemented as switch mp5 172 is coupled to the node N4 158. The makeup current source 170 is configured to advantageously generate a current I7 174 that is equal to a deviation or imbalance Idiff in the current. A sum of currents at node N4 158 is advantageously made equal to zero during the steady-state as well as during the overload condition. That is, the current I6 164 is advantageously maintained at 50% of Ib 194 by adjusting the current I7 174 in accordance with the deviation in the current I5 156 during the overload condition.

In the depicted embodiment, a multiplier current source includes a switch mp6 176 that is controlled by the mp5 172 current mirror. The current flowing through the switch mp6 176 is the overload current I8 154 and is derived from or is a function of the current I7 174. In a particular embodiment, the overload current I8 154 is configured to be twice the current I7 174. That is, the current I8 is 2*I7 174, the current I7 174 being equal to Idiff (same as deltaI). The transistor switches mp5 172 and mp6 176 are sized in accordance with the current multiplication factor. The overload current I8 154 is provided to the folded cascode amplifier 110 through the controller 180.

The time to recover the improved amplifier 100 from the overload condition is advantageously reduced compared to the traditional folded cascode amplifier by generating additional overload current 154 to charge the parasitic capacitance or the compensation capacitor of the at least one transistor and enable the current starved transistor switches mn4 145 and mn7 147 to operate in the saturation region. In a particular embodiment, the overload current I8 154 is adjustable to recover from the overload condition within a configurable recovery time, which may vary based on desired performance of each high speed circuit application. Thus, the improved amplifier 100 is ready to be operational when the stimulus is removed, e.g., when the deviation between the inputs Vinm 112 and Vinp 114 becomes less than the threshold.

FIG. 1B illustrates in a tabular form an analysis of currents flowing through the improved amplifier 100 operating in a steady-state and in an overload condition described with reference to FIG. 1A, according to an embodiment. Referring to FIGS. 1A and 1B, as described earlier, at steady-state the value of Vinm 112 is equal to Vinp 114. A column 104 of table 102 lists values for the various currents flowing through the improved amplifier 100 operating in the steady-state. The switches mn3 144, mn6 146, mn4 145, and mn7 147 are operating in the saturation region and current imbalance in zero. Current I7 174 (equal to Idiff) is zero and the overload current 154 generated by the ORC 150 is also zero.

As described earlier, in the overload condition Vinm 112 a difference between the Vinm 112 and Vinp 114 is greater than a threshold. In the depicted embodiment, Vinm 112 is greater than Vinp 114 by at least the threshold amount. A column 106 of table 102 lists values for the various currents flowing through the improved amplifier 100 operating in the overload condition caused by Vinm 112 being greater than Vinp 114 by more than the threshold. The differential input being greater than the threshold causes an imbalance in the current flowing through the improved amplifier 100 compared to the current flowing in the steady-state. Specifically, Im 196 is reduced by a deviation current (deltaI, which is the same as Idiff) compared to the steady-state current and the current Ip is increased by the same deviation current deltaI. The currents for mn6 146 and mn7 147 are provided by Ip 198 plus I1 and Im 196 plus I2 138 respectively. The current I3 131 flowing through mn6 146 is equal to Ip 198 plus I1. Current I3 131 is also equal to Ib 196 due to the vnbias2 149. Hence, I1 136 is Ib/2 minus deltaI. Since I2 138 is a mirror of I1 136, I2 138 is also equal to Ib/2 minus deltaI. Switch mn7 receives Im 196 (Ib/2 minus deltaI) and desires Ib/2 plus deltaI from mn4 145 to achieve equilibrium and continue to operate in the saturation region. However, mn4 145 is operable to provide only I2 138, which is equal to Ib/2 minus deltaI current, thereby causing the deficit in the current and causing the switches mn4 145 and mn7 147 to operate in a triode region. The deficit in the current to achieve current balance at node N2 132 is 2*deltaI. The ORC 150 generates I7 174 (same as Idiff and deltaI) and the overload current I8 154 which is equal to is 2*deltaI.

In a particular embodiment, the improved amplifier 100 may be configured to have the output fed back as one of the inputs to achieve unity gain. Various embodiments of an improved amplifier configured as a unity gain follower and having an improved recovery time from an overload condition compared to a traditional amplifier are described with reference to FIGS. 2, 3, and 4.

Figure 2:
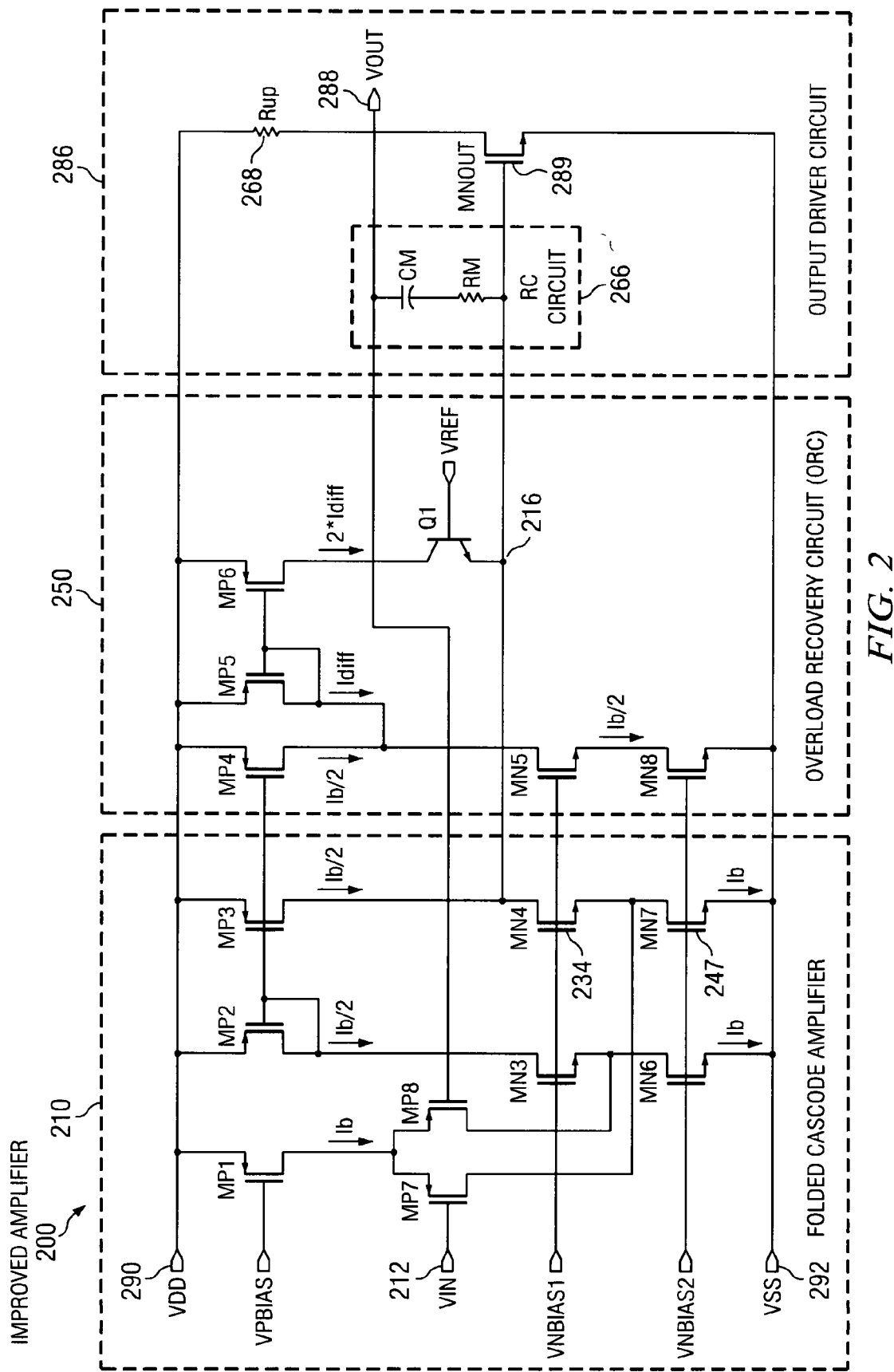
FIG. 2 illustrates a circuit diagram of an improved amplifier having a unity gain, according to an embodiment.

FIG. 2 illustrates a circuit diagram of an improved amplifier 200 having a unity gain, according to an embodiment. In the depicted embodiment, the improved amplifier 200 is substantially similar to the improved amplifier 100 described with reference to FIGS. 1A, and 1B except for a unity gain configuration (output is coupled as a feedback to one of the two inputs) and an inclusion of an additional output driver circuit. In the depicted embodiment, the improved amplifier 200 includes a folded cascode amplifier 210 that is coupled to an overload recovery circuit (ORC) 250 and an output driver circuit 286. The operation of the folded cascode amplifier 210 is substantially the same as the operation of the folded cascode amplifier 110 described with reference to FIGS. 1A, and 1B. Similarly, the operation of the ORC 250 is substantially the same as the operation of the ORC 150 and controller 180 described with reference to FIGS. 1A, and 1B.

In a particular embodiment, the improved amplifier 200 is configured as a unity gain follower circuit having a built-in direct current (DC) offset. That is, an output Vout 288 of the improved amplifier 200 is configured to track an input signal received at Vin 212, where the output Vout 288 is also offset by a configurable DC voltage, e.g., 0.1 volts, relative to the input signal. In a particular embodiment, it may be desirable to disable the Vout 288 during an overload condition, e.g., when both the Vin 212 and Vout 288 are forced to 0 volts by external open-drain drivers (not shown).

The output driver circuit 286 is operable to disable the output Vout 288 of the improved amplifier 200 during an overload condition. In the depicted embodiment, the output driver circuit 286 includes a driver switch mnout 289, an RC circuit 266, and a pull-up resistor Rup 268 coupled between Vdd 290 and Vout 288. In a particular embodiment, the driver switch mnout 289 includes a gate that is coupled to an ORC output 216 (same as the Vout 116 described with reference to FIGS. 1A and 1B), a drain coupled to the Vout 288, and a source coupled to Vss 292. Thus, a voltage at the ORC output 216 is used as a bias signal to control the operation of the driver switch mnout 289. The pull-up resistor Rup 268 acts as a load for the common source output stage formed by mnout 289. The RC circuit 266, which includes a compensation capacitance Cm coupled in series with a resistance Rm, is disposed between the Vout 288 and the ORC output 216.

A traditional folded cascode amplifier without the ORC 250 and the output driver circuit 286 would be forced to operate in an overload condition in response to its input and output being forced to 0 volts by external open-drain drivers. Without the ORC 250 and the output driver circuit 286, the switches mn4 234 and mn7 247 operate in the triode region. When the external driver (not shown) at mnout 289 is released, it is desirable that the improved amplifier 200 rapidly return the output Vout 288 to actively track the input signal, the output Vout 288 being offset by 0.1 volts (or equal to the configured DC offset value) above the input Vin 212. The traditional folded cascode amplifier is slower to recover or react from the overload since at least one of the switches mn4 234 and mn7 247 operate in the triode region. In addition, the traditional folded cascode amplifier also uses available current to charge the parasitic gate capacitances and the compensation capacitor Cm before becoming operational.

The ORC 250 and the output driver circuit 286 advantageously maintains a bias voltage of the gate of mnout 289 just low enough to switch off mnout 289, but barely into subthreshold when the folded cascode amplifier 210 is overloaded. In this manner, the Vout 288 is disabled as desired, yet enabling the improved amplifier 200 to rapidly turn mnout 288 back on when the external open-drain driver is released. The gate of mnout 288 is advantageously biased at a level of (Vt−deltaV) instead of at a ground reference, where Vt is the threshold voltage of mnout 289 and deltaV is a configurable voltage to maintain a subthreshold state. Thus, the parasitic capacitances and the compensation capacitance Cm is charged by the minimum amount (deltaV) to get the gate of mnout 289 back up to the Vt level, thereby enabling a rapid recovery of the improved amplifier 200 from the overload condition.

Figure 3:
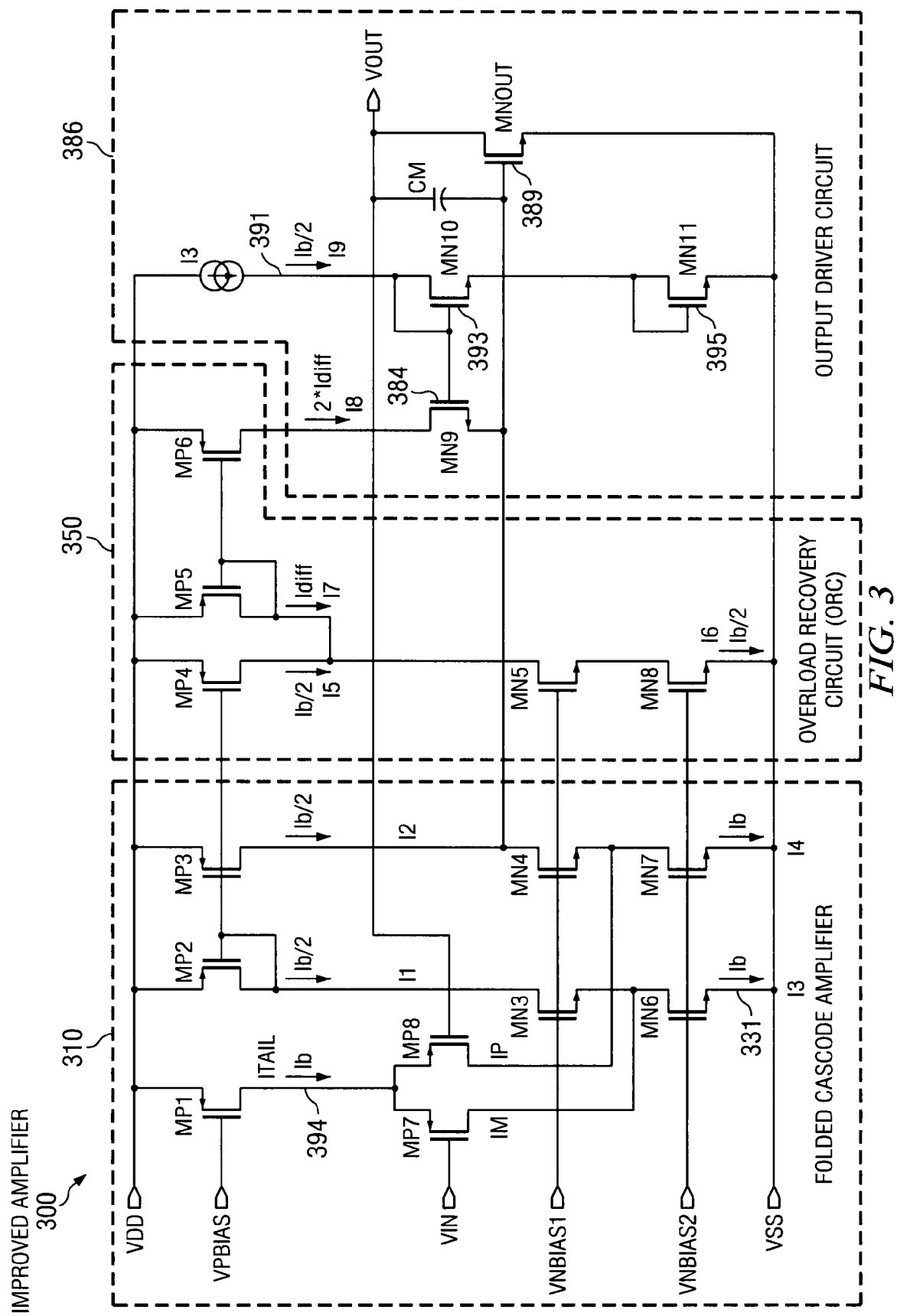
FIG. 3 illustrates a circuit diagram of an improved amplifier with complementary metal oxide semiconductor (CMOS) devices and having a unity gain, according to an embodiment.

FIG. 3 illustrates a circuit diagram of an improved amplifier 300 with complementary metal oxide semiconductor (CMOS) devices and having a unity gain, according to an embodiment. In the depicted embodiment, the improved amplifier 300 is implemented by using CMOS devices, which consume less power, and is substantially similar to the improved amplifier 200 described with reference to FIG. 2, which uses a combination of CMOS and BJT devices. In the depicted embodiment, the improved amplifier 300 includes a folded cascode amplifier 310 that is coupled to an overload recovery circuit (ORC) 350 and an output driver circuit 386. The operation of the folded cascode amplifier 310 is substantially the same as the operation of the folded cascode amplifier 210 described with reference to FIG. 2. The ORC 350 is substantially similar to the ORC 250 except for the implementation of the controller 280. The output switch 284 implemented as a BJT is implemented as a CMOS device switch mn9 384 and the bias voltage 182 is controlled by Vref generator current I9 391 flowing through mn10 393 and mn11 395, the current I9 being controlled by I3 331. In a steady-state mode, I9 391 is 50% of Ib 394. In overload mode, gate-to-source voltage of switch mnout 389 is the same as the gate-to-source voltage of switch mn11 395. The switch mn11 395 is matched and sized such that the drain-to-source current flowing through mn11 395, which is equal to I9 391, is sufficient to maintain mnout 389 in the subthreshold state.

Figure 4:
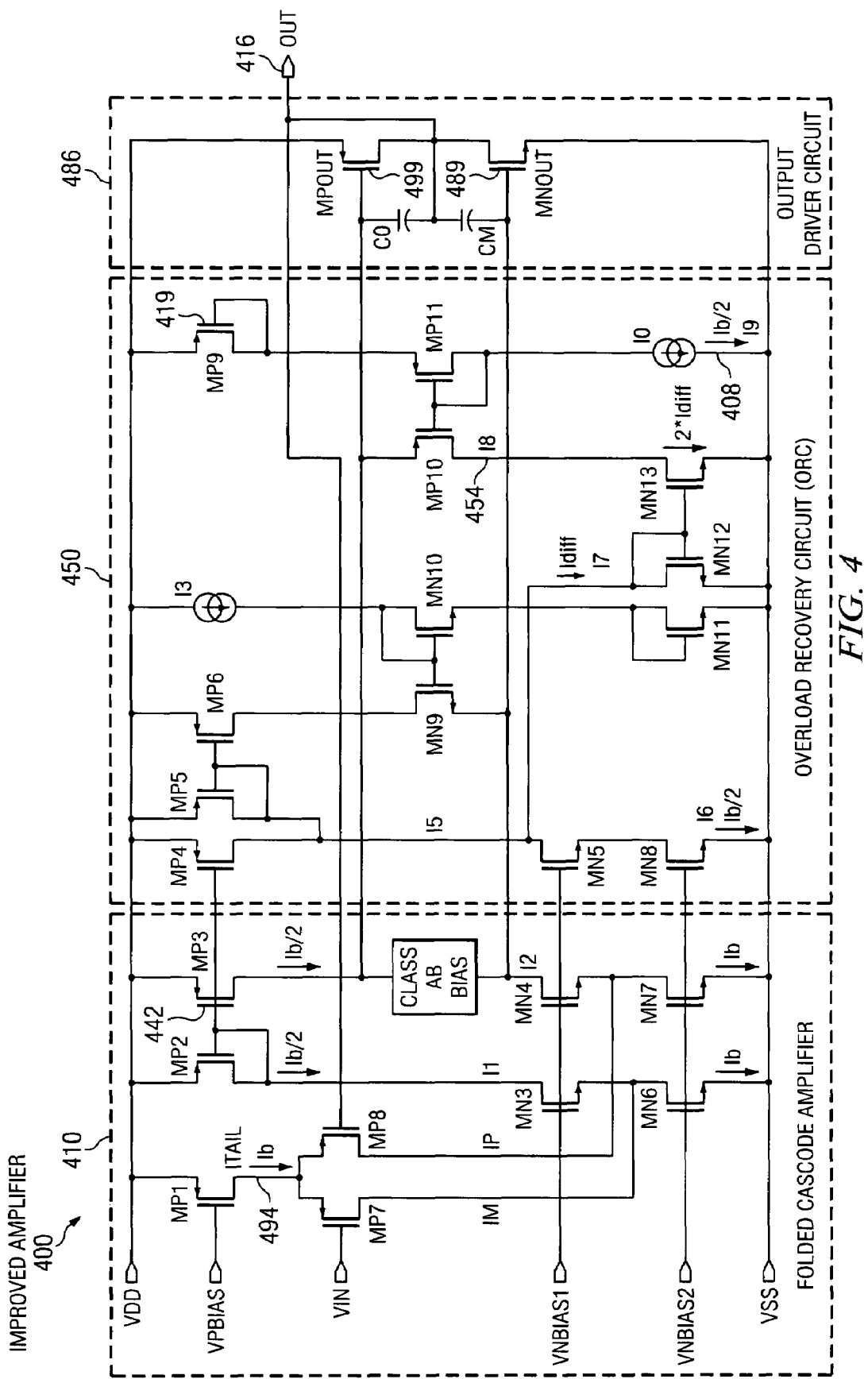
FIG. 4 illustrates a circuit diagram of an improved amplifier using CMOS devices and having a push-pull output stage and a unity gain, according to an embodiment.

FIG. 4 illustrates a circuit diagram of an improved amplifier 400 using complementary metal oxide semiconductor (CMOS) devices and having a push-pull output stage and a unity gain, according to an embodiment. In the depicted embodiment, the improved amplifier 400 is substantially similar to the improved amplifier 300 described with reference to FIG. 3 except for a push-pull output type output driver circuit 486. A folded cascode amplifier 410 is similar to the folded cascode amplifier 310 described with reference to FIG. 3 except for providing two output signals that are controlled by a Class AB BIAS block and provided to the respective gates of an N-channel output switch mnout 489 and a P-channel output switch mpout 499 to control their operation. An overload recovery circuit (ORC) 450 is similar to the ORC 350 described with reference to FIG. 3 except for having duplicate current mirror circuits for providing a push-pull type output.

The improved amplifier 400 is operable to provide a rapid recovery from overload conditions that may be caused when a difference between the two inputs may be positive or negative. The output driver circuit 486 includes a drain of the N-channel output switch mnout 489 coupled to a drain of the P-channel output switch mpout 499 to form the Vout 416. In an overload condition, I8 454 is just sufficient to keep mp3 442 in saturation and gate-to-source voltage of mpout 499 is equal to gate-to-source voltage of mp9 419. Current I9 408 flowing through mp9 419 is equal to 50% of Ib 494 during steady-state as well as during the overload condition. The switch mp9 419 is matched and sized for the current I9 408 to keep mpout 499 in the substhreshold state.

Figure 5:
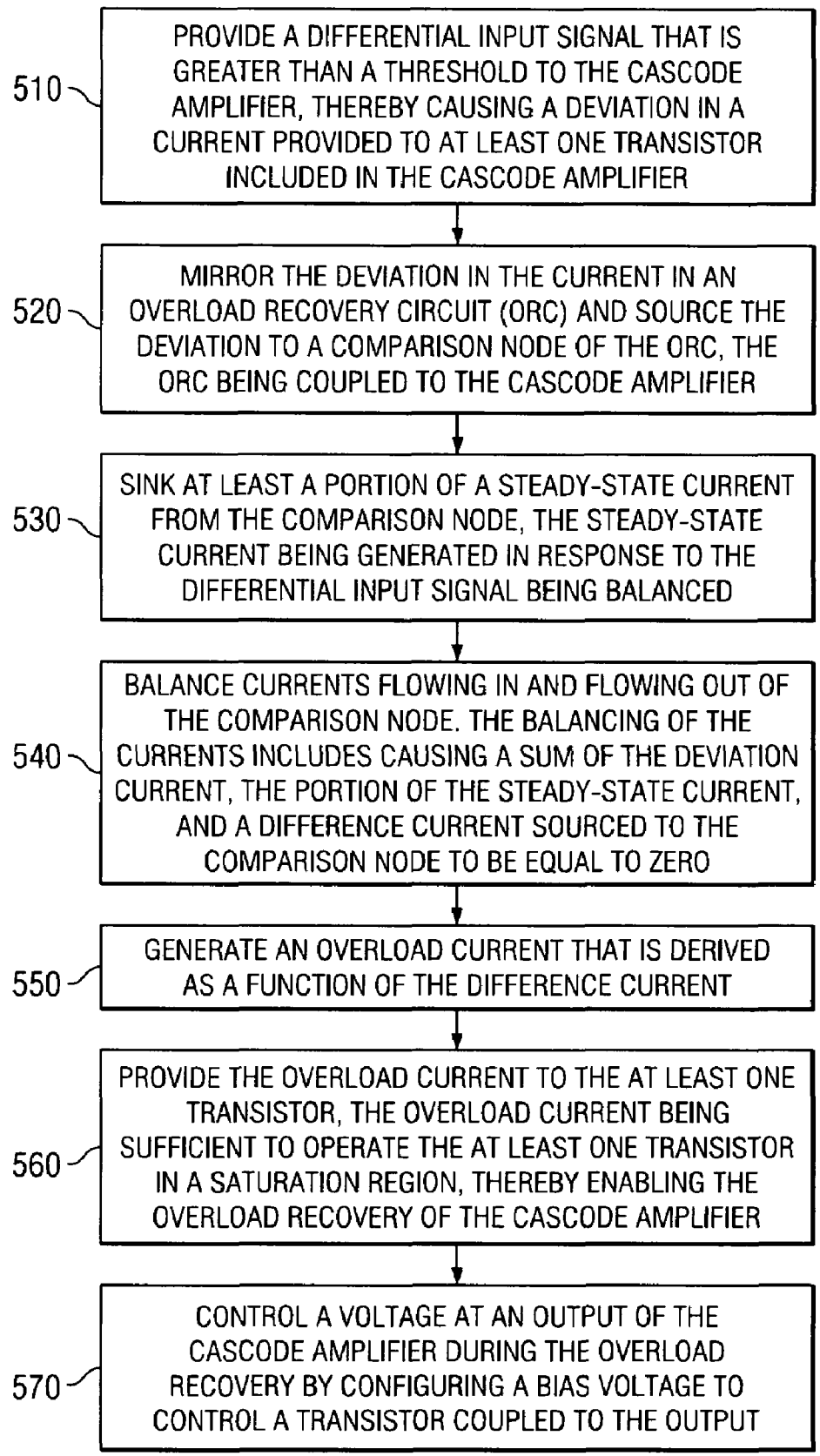
FIG. 5 is a flow chart illustrating a method for overload recovery of a cascode amplifier, according to an embodiment.

FIG. 5 is a flow chart illustrating a method for overload recovery of a cascode amplifier, according to an embodiment. In a particular embodiment, the method is used to rapidly recover any one of the improved amplifiers 100, 200, 300 or 400 described with reference to FIGS. 1A, 1B, 2, 3, and 4, from an overload condition. At step 510, a differential input signal that is greater than a threshold is provided to the cascode amplifier, thereby causing a deviation in a current provided to at least one transistor included in the cascode amplifier. At step 520, the deviation in the current is mirrored in an overload recovery circuit (ORC) and sourced to a comparison node of the ORC, the ORC being coupled to the cascode amplifier. At step 530, at least a portion of a steady-state current is drawn from the comparison node, the steady-state current being generated in response to the differential input signal being balanced. At step 540, currents flowing in and flowing out of the comparison node are balanced. The balancing of the currents includes causing a sum of the deviation current, the portion of the steady-state current, and a difference current sourced to the comparison node to be equal to zero. At step 550, an overload current is generated, the overload current being derived as a function of the difference current. At step 560, the overload current is provided to the at least one transistor, the overload current being sufficient to operate the at least one transistor in a saturation region, thereby enabling the overload recovery of the cascode amplifier.

Various steps described above may be added, omitted, combined, altered, or performed in different orders. For example, step 570 may be added. At step 570, a voltage at an output of the cascode amplifier is controlled during the overload recovery by configuring a bias voltage to control a transistor coupled to the output.

Several advantages are achieved by the method and system according to the illustrative embodiments presented herein. The embodiments advantageously provide an improved amplifier that is operable to rapidly recover from an overload condition especially when compared to the recovery time for an overloaded traditional amplifier. The recovery time is advantageously improved by generating additional current that is sufficient to enable the transistors to operate in the saturation region instead of operating in the triode region. Rapid recovery from the overload condition may advantageously enable the improved amplifier to be included in time sensitive applications such as high speed analog or mixed signal circuits such as wireless communication. The improved amplifier also advantageously controls a voltage at the output to a desired level. That is, instead of allowing the voltage at the output of the traditional amplifier in an overload condition to swing to a high or low power supply voltage, the voltage at the output of the improved amplifier is advantageously controlled to the desired level. Controlling the voltage at the output may also advantageously reduce the recovery time since the parasitic capacitances of the transistors are not fully discharged during the overload condition. In some applications, controlling the voltage at the output may be used to advantageously disable the output during the overload condition.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of using circuits, those of ordinary skill in the art will appreciate that the apparatus and methods disclosed herein are capable of being implemented as semiconductor devices including integrated circuit chips. As another example, the various switches described with reference to the improved amplifier may be implemented using CMOS semiconductor devices or implemented using a combination of CMOS and BJT semiconductor devices.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An apparatus comprising:
    a cascode amplifier having a pair of inputs and an output, wherein the pair of inputs is coupled to receive a differential input signal, wherein a deviation in the differential input signal greater than a threshold causes a deviation in a current provided to at least one transistor included in the cascode amplifier, the deviation in the current causing the cascode amplifier to operate in an overload condition; and
    an overload recovery circuit (ORC) coupled to the cascode amplifier, wherein the ORC includes:
        a makeup current circuit operable to generate an overload current in response to the overload condition;
        a controller operable to control a voltage at the output during the overload condition, wherein the controller coupled to the makeup current circuit provides the overload current to the cascode amplifier.

2. The apparatus of claim 1, wherein the deviation in the current causes the at least one transistor to operate in a triode region, thereby causing the overload condition.

3. The apparatus of claim 1, wherein the deviation in the current is measurable from a steady-state current provided to the at least one transistor operating in a saturation region, wherein the steady-state current is provided in response to the differential input signal being balanced.

4. The apparatus of claim 1, wherein the overload current is provided to the at least one transistor to enable the at least one transistor to operate in a saturation region and further enable the at least one transistor to recover from the overload condition.

5. The apparatus of claim 1, wherein the makeup current circuit includes:
    a deviation current source coupled to a comparison node, the deviation current source being operable to provide a mirror of the deviation in the current to the comparison node;
    a pair of cascoded transistors coupled to the comparison node, the pair of cascoded transistors being operable to sink at least a portion of a steady-state current generated in response to the differential input signal being balanced;
    a makeup current source coupled to the comparison node, the makeup current source being operable to provide a difference current between the deviation in the current and the portion of the steady-state current to balance currents at the comparison node; and
    a multiplier current source operable to generate the overload current, the overload current being derived from the difference current, the overload current being sufficient to operate the at least one transistor in a saturation region.

6. The apparatus of claim 5, wherein the overload current is twice the difference current.

7. The apparatus of claim 1, wherein the controller is a transistor, wherein a base of the transistor is biased by a reference voltage, wherein the voltage at the output is the reference voltage less a base-to-emitter voltage across the transistor, an emitter of the transistor being coupled to the output.

8. The apparatus of claim 7, wherein the reference voltage is configurable to offset a temperature dependence of the base-to-emitter voltage.

9. The apparatus of claim 1, wherein the overload current is adjustable to recover from the overload condition within a configurable recovery time.

10. The apparatus of claim 9, wherein the configurable recovery time is less compared to a corresponding recovery time for a traditional cascode amplifier without the ORC.

11. The apparatus of claim 9, wherein the overload current is used to charge a parasitic capacitance of the at least one transistor, thereby causing a reduction in the configurable recovery time.

12. The apparatus of claim 1, wherein the overload current is zero when the differential input signal is balanced.

13. A method for overload recovery of a cascode amplifier, the method comprising:
  providing a differential input signal that is greater than a threshold, thereby causing a deviation in a current provided to at least one transistor included in the cascode amplifier;
  mirroring the deviation in the current in an overload recovery circuit (ORC), the deviation in the current being sourced to a comparison node of the ORC, the ORC being coupled to the cascode amplifier;
  sinking at least a portion of a steady-state current from the comparison node, the steady-state current being generated in response to the differential input signal being balanced;
  balancing currents at the comparison node, wherein the balancing includes causing a sum of the deviation current, the portion of the steady-state current, and a difference current sourced to the comparison node to be equal to zero;
  generating an overload current, the overload current being derived as a function of the difference current; and
  providing the overload current to the at least one transistor, the overload current being sufficient to operate the at least one transistor in a saturation region, thereby enabling the overload recovery of the cascode amplifier.

14. The method of claim 13 further comprising:
  controlling a voltage at an output of the cascode amplifier during the overload recovery, wherein the voltage at the output is controlled by configuring a bias voltage to control a transistor coupled to the output.

15. The method of claim 13, wherein the overload current is twice the difference current.

16. An apparatus comprising:
  a cascode amplifier having a pair of inputs and an output, wherein the output is coupled to a first one of the pair of inputs in a unity gain configuration of the cascode amplifier, wherein a second one of the pair of inputs is coupled to receive an input signal, wherein an output signal provided at the output is configured to add a bias voltage to the input signal, wherein the output signal and the input signal being forced to zero causes a deviation in a current provided to at least one transistor included in the cascode amplifier, the deviation in the current causing the cascade amplifier to operate in an overload condition;
  an overload recovery circuit (ORC) coupled to the cascode amplifier, wherein the ORC includes:
    a makeup current circuit operable to generate an overload current in response to the overload condition;
    a controller operable to control a base voltage during the overload condition, wherein the controller coupled to the makeup current circuit provides the overload current to the cascode amplifier; and
  an output driver circuit coupled to the ORC and the cascode amplifier, wherein the output driver circuit includes a driver switch controlled by the base voltage, the driver switch being operable to disable the output in response to the overload condition.

17. The apparatus of claim 16, wherein the base voltage is configured to be slightly below a threshold voltage of the driver switch during the overload condition.

18. The apparatus of claim 16, wherein the output is enabled by controlling the base voltage to be above a threshold voltage of the driver switch.

19. The apparatus of claim 16, wherein the output driver circuit includes:
  an RC circuit coupled between the output and the base of the driver switch, wherein the RC circuit includes a compensation capacitor coupled in series with a resistor, wherein a recovery time from the overload condition is less compared to a corresponding recovery time for a traditional cascode amplifier without the RC circuit.

20. The apparatus of claim 19, wherein the overload current is used to charge a parasitic capacitance of the at least one transistor and the compensation capacitor, thereby causing a reduction in the recovery time.

* * * * *